United States Patent [19]

McManus et al.

[11] Patent Number: 5,528,447
[45] Date of Patent: Jun. 18, 1996

[54] 5-VOLT TOLERANT BI-DIRECTIONAL I/O PAD FOR 3-VOLT-OPTIMIZED INTEGRATED CIRCUITS

[75] Inventors: Michael J. McManus, Fort Collins; Philip W. Bullinger, Loveland; Andres R. Teene, Fort Collins; Gerald R. Haag, Fort Collins; Hoang P. Nguyen, Fort Collins, all of Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 315,799

[22] Filed: Sep. 30, 1994

[51] Int. Cl.$^6$ .................................................. H02H 3/20
[52] U.S. Cl. .......................... 361/91; 361/56; 361/111
[58] Field of Search ............................ 361/91, 111, 56, 361/54, 86, 100–101

[56] References Cited

U.S. PATENT DOCUMENTS 4,922,371  5/1990  Gray et al. ................................. 361/91

Primary Examiner—A. D. Pellinen
Assistant Examiner—Michael J. Sherry
Attorney, Agent, or Firm—Wayne P. Bailey; Daniel N. Fishman

[57] ABSTRACT

In an electronic IC package, an I/O PAD circuit design which protects 3 Volt optimized I/O functional circuits from damage due to the application of external 5 Volt signals to the I/O PAD both while the functional circuit design is powered on and powered off. When the I/O circuits associated with the I/O PAD are powered on, the present invention protects the I/O circuits by applying well known designs. However, when the I/O circuits associated with the I/O PAD are powered off, the present invention draws power from the external 5 Volt signal to activate additional transistors to protect the powered off I/O circuits.

8 Claims, 2 Drawing Sheets

PRIOR ART

5-VOLT TOLERANT BI-DIRECTIONAL I/O PAD FOR 3-VOLT-OPTIMIZED INTEGRATED CIRCUITS

FIELD OF THE INVENTION

The present invention relates to a circuit design useful in integrated circuit devices for buffering and protecting interconnected devices optimized for different voltage sources.

BACKGROUND OF THE INVENTION

In integrated circuit technology, devices in different integrated circuit (hereinafter referred to as "IC") packages are interconnected to one another at I/O PADS associated with each IC package. I/O PADS are associated with electrical circuits which perform a desired function to interface with other IC packages or electrical devices. An I/O PAD may be associated with electrical circuits which generate output signals and apply the signals to the I/O PAD for external devices to sense and process accordingly. Alternatively, an I/O PAD may be associated with electrical circuits which sense the logic state of signals applied to the I/O PAD by external electrical circuits or IC packages. I/O PADS are frequently "bi-directional" in the sense that they may be used at different times for the sensing of input signals to the IC package or for the application of output signals from the IC package. Electrical output signals are applied to an I/O PAD by electrical circuits within the IC package associated with the I/O PAD. Similarly, electrical input signals are received as input signals from an I/O PAD by associated electrical circuits within the IC package which "sense" the signal level and operate accordingly.

It is common for such interconnected circuits to utilize standard voltage levels to represent logic states of "0" and "1" (or "ON" and "OFF"). Common standard voltage levels in the past have been 0 Volts (± a threshold value) to represent one logic state and 5 Volts (± a threshold value) to represent the other logic state. As new IC manufacturing technologies evolve the voltage levels used may change. For example, in the manufacture of many current IC devices using sub-micron semiconductor fabrication processes, the semiconductor industry has begun to standardize on 3 Volt (more precisely, 3.3 Volt ± a threshold value) in place of 5 Volt signal levels to improve performance and reduce power dissipation. The lower voltage level permits reduced thickness in transistor gate oxide materials to thereby reduce switching time of transistor gates and improve performance of the switching circuitry.

A problem arises when such IC packages optimized for 3 Volt operation are used in conjunction with other IC packages optimized for 5 Volt operation. Transistor gates and other circuits optimized for 3 Volt operation may not withstand the application of 5 Volt signals to their I/O PADS from other interconnected IC packages. The 5 Volt signals may breakdown the thinner oxide layers of the 3 Volt optimized I/O circuits causing current leakage or even permanent destruction of the oxide layers.

It is well known to those of ordinary skill in the art to provide additional gates to protect the 3 Volt optimized circuit from the potential damage due to application of 5 Volt signals. However, the known prior designs provide such protection only when the 3 Volt circuit has source power applied. If the 3 Volt optimized circuit is powered off when a higher voltage signal is applied to one of its I/O PADS, the thinner oxide layers may still be damaged because the additional gates added for protection are non-functional without the source power. Many common applications require such protection of I/O PADS when the associated I/O circuitry is powered off.

From the above, it can be seen that there is a need for an IC I/O PAD design which protects the associated functional circuit from potential damage due to the application of excessively high voltage signals to the I/O PAD. Furthermore the protection must be operable both while the associated circuitry is powered on and while powered off.

SUMMARY OF THE INVENTION

In accord with the preferred embodiment of the invention, I/O circuitry associated with an I/O PAD of an IC package is optimized for 3 Volt operation. Additional protective circuitry is supplied by the present invention which protects the 3 Volt optimized I/O circuitry from damage due to application of a 5 Volt signal to the I/O PAD. The protective circuitry of the present invention protects the 3 Volt optimized circuitry both when the source voltage of the I/O circuitry is powered on and when powered off.

The protective circuitry of the present invention operates in a manner similar to well known prior designs when the 3 Volt optimized I/O circuitry is powered on. However, when the 3 Volt optimized I/O circuits are powered off, the additional protective circuitry of the present invention operates from power supplied by the external 5 Volt signal applied to the I/O PAD. In addition, the protective circuitry of the present invention operates in a manner so as to minimize the power dissipated in the IC package due to the power drawn from the external 5 Volt signal through the I/O PAD.

The present invention advantageously protects 3 Volt optimized I/O circuitry from damage due to application of an external 5 Volt signal to an I/O PAD regardless of whether the 3 Volt optimized I/O circuitry is powered on or off.

It is therefore an object of the present invention to protect I/O related circuits optimized for 3 Volt operation and associated with an I/O PAD from damage due to the external application of a 5 Volt signal to the I/O PAD.

It is a further object of the present invention to provide protection for 3 Volt optimized I/O circuits associated with an I/O PAD regardless of whether the I/O circuits have a 3 Volt power source applied.

It is yet a further object of the present invention to minimize the power dissipated and drawn from the external 5 Volt source applied to the I/O PAD of I/O circuits optimized for 3 Volt operation.

The above and other objects, features, and advantages of the present invention will become apparent from the following description and the attached drawing.

BRIEF DESCRIPTION OF THE DRAWING

FIG. 2 is a circuit diagram of a common prior design of an I/O PAD and associated functional I/O circuitry with protective circuitry operable only when powered on.

DETAILED DESCRIPTION OF THE PREFERRED EMBODIMENT

Figure 1:
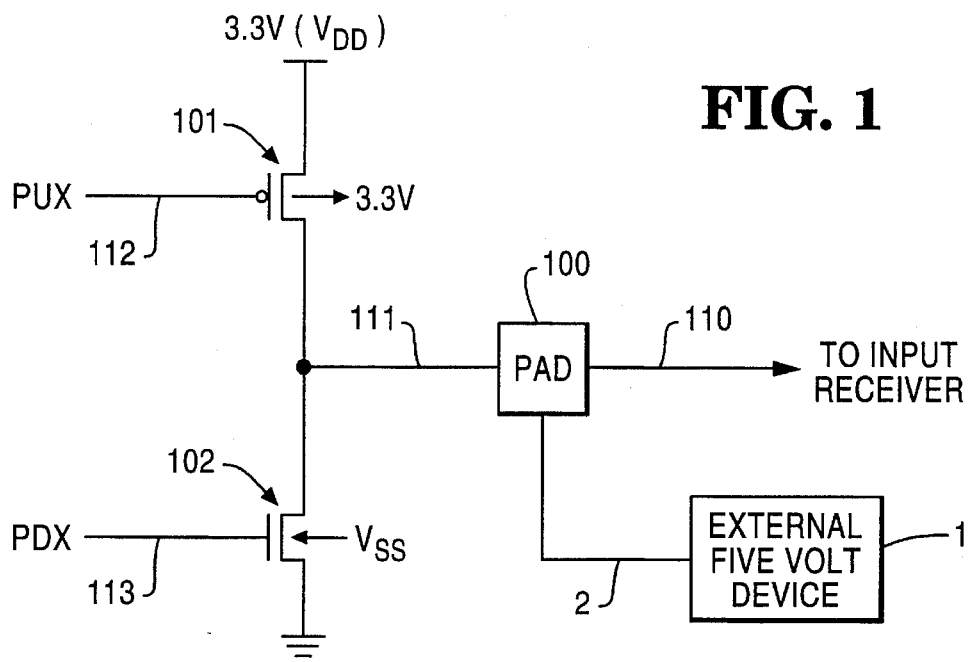
FIG. 1 is a circuit diagram of a common prior design of an I/O PAD and associated functional I/O circuitry without any protective circuitry.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

FIG. 1 illustrates a typical I/O PAD design well known to one of ordinary skill in the art. Electrical signals from external circuits 1 are applied to I/O PAD 100 via conductor 2. Input receiver signal processing circuits sense the signals applied to I/O PAD 100 via conductor 110 and process the signal appropriately. In other conditions, electrical signals representing a logic level "1" or "0" are applied to I/O PAD 100 via conductor 111 as output signals for transmission to external circuits 1 over conductor 2. PUX (pull-up circuitry) applies a signal to conductor 112 when a high voltage level signal ($V_{dd}$) is to be applied as an output signal on PAD 100 via conductor 111. PDX (pull-down circuitry) applies a signal to conductor 113 when a low voltage level signal ($V_{ss}$) is to be applied as an output signal on PAD 100 via conductor 111. PUX is normally at an inactive high voltage level ($V_{dd}$) and PDX is normally at an inactive low voltage level ($V_{ss}$). In this state, the gates of p-channel type MOSFET 101 and n-channel MOSFET 102 are both open. The source and substrate of p-channel MOSFET 101 are connected to the $V_{dd}$ voltage source. The source and substrate of n-channel MOSFET 102 are connected to $V_{ss}$. The drains of both p-channel MOSFET 101 and n-channel MOSFET 102 are connected to conductor 111. When the gates of p-channel MOSFET 101 and n-channel MOSFET 102 are both open, no output signal is applied to conductor 111; conductor 111 is "tri-stated" so that an input signal may applied by external circuits 1 over conductor 2 to I/O PAD 100 and may be sensed by input receiver signal processing circuits.

When PUX applies an active low signal to conductor 112, the gate of p-channel MOSFET 101 is closed so that conductor 111 is "pulled up" to $V_{dd}$ as to thereby apply a high voltage level signal to I/O PAD 100 for transmission to external circuits 1 over conductor 2. When PDX applies an active high signal to conductor 113, the gate of n-channel MOSFET 102 is closed so that conductor 111 is "pulled down" to $V_{ss}$ to thereby apply a low voltage level signal to I/O PAD 100 for transmission to external circuits 1 over conductor 2.

When the circuit of FIG. 1 is implemented, as depicted, optimized for $V_{dd}$ at 3 Volts (more precisely 3.3 Volts), only 3 Volt and lower signals may be applied to I/O PAD 100 by external circuits 1 over conductor 2. Application of 5 Volt electrical signals to I/O PAD 100 may damage the thinner material used in the gate oxide of MOSFETs 101 and 102 (as well as circuitry relating to the input receiver). For example, if a 5 Volt signal were applied to I/O PAD 100 by external circuits 1 over conductor 2 while the I/O circuits are powered on and in the "tri-state" condition discussed above, the gate oxide of n-channel MOSFET 102 would have a 5 Volt potential across the drain to gate junction. If this potential were sustained for more than a brief transient period, the thin gate oxide layer, optimized for 3 Volt operation, could be damaged.

Figure 2:
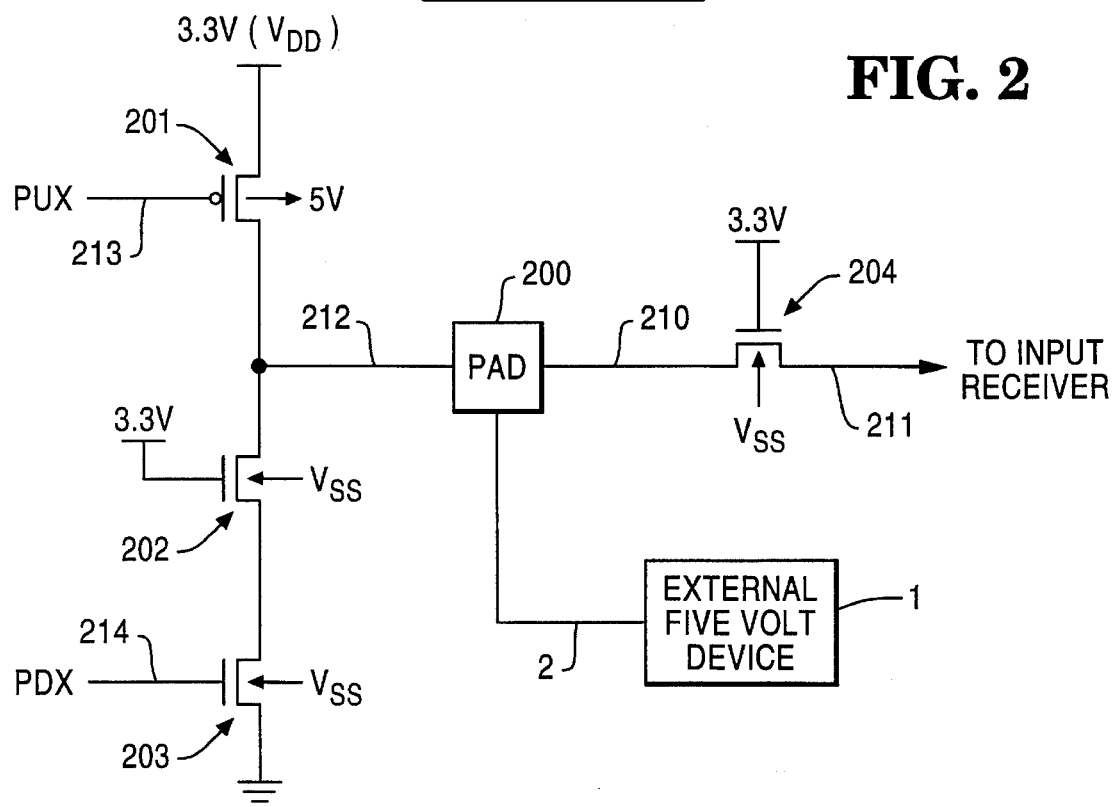

Other prior designs have sought to partially resolve this problem by providing additional transistor gating to protect the I/O circuitry shown in FIG. 1. FIG. 2 illustrates a typical circuit, well known to those of ordinary skill in the art, which allows for tolerance of 5 Volt signals being applied to an I/O PAD 200 of a 3 Volt optimized design.

The circuit depicted in FIG. 2 operates in most respects identically to that of FIG. 1. Electrical signals applied by external circuits 1 over conductor 2 to I/O PAD 200 are sensed by input receiver circuitry via conductor 211. However, the electrical signal applied to I/O PAD 200 is first applied to the source of n-channel transistor 204 via conductor 210. The gate of transistor 204 is connected to $V_{dd}$ (3.3 Volts) and its substrate is connected to $V_{ss}$ which thereby limits the voltage passed through to the drain of the transistor to $V_{dd}$ (3.3 Volts). Regardless of whether the signal applied to I/O PAD 200 is 3 Volts or 5 Volts, no more than $V_{dd}$ (3.3 Volts) is passed through transistor 204 and applied to conductor 211 for further processing by input receiver circuitry. The gate oxide of transistor 204 is protected from damage because the potential between either its gate and source or gate and drain will not exceed $V_{dd}$ (3.3 Volts) because the gate is held at $V_{dd}$. Transistor 204 protects the input receiver circuitry from potential damage caused by external circuits 1 applying 5 Volt electrical signals to I/O PAD 200 over conductor 2.

Electrical signals applied to conductors 213 and 214 by PUX and PDX circuits, respectively, serve to "tri-state", "pull-up", or "pull-down" conductor 212 by controlling of the gates of transistors 201 and 203, respectively. One of these three states is applied through conductor 212 onto I/O PAD 200 to drive output signals out to external circuitry 1 over conductor 2 or to permit external circuitry 1 to apply signals to I/O PAD 200 over conductor 2. The gate of n-channel transistor 202 is connected to $V_{dd}$ (3.3 Volts) and the substrate is connected to $V_{ss}$ which thereby limits any voltage applied to the drain of transistor 203 to $V_{dd}$ (3.3 Volts). Transistor 202 thereby protects transistor 203 from potential damage to the gate oxide of transistor 203 by external circuits 1 applying 5 Volt electrical signals to I/O PAD 200 over conductor 2. In addition, transistor 201 has its substrate connected to 5 Volts to prevent a 5 Volt signal applied to I/O PAD 200 from forward biasing the drain-substrate junction of transistor 201 to thereby damage or otherwise interfere with the $V_{dd}$, source voltage supply. If the substrate of transistor 201 were connected to $V_{dd}$, as in FIG. 1, and a 5 Volt signal were applied to I/O PAD 200, then current would flow from I/O PAD 200, through the drain-substrate junction of transistor 201, back to the power source.

The addition of transistors 202 and 204 as depicted in FIG. 2 provides adequate protection of the I/O circuitry while the I/O circuits are powered on. However, if the I/O circuitry is powered off, n-channel transistors 201, 202, and 204 are potentially damaged by external circuits 1 applying a 5 Volt signal to I/O PAD 200 over conductor 2. Specifically, n-channel transistors 201, 202, and 204 will each have a 5 Volt electric potential across their gate-drain junctions. As described above, this excessive electric field may damage the thin gate oxide layer optimized for 3 Volt operation if it is applied for longer than a brief transient period. Such an excessive voltage is referred to herein as an "excess voltage."

Figure 3:
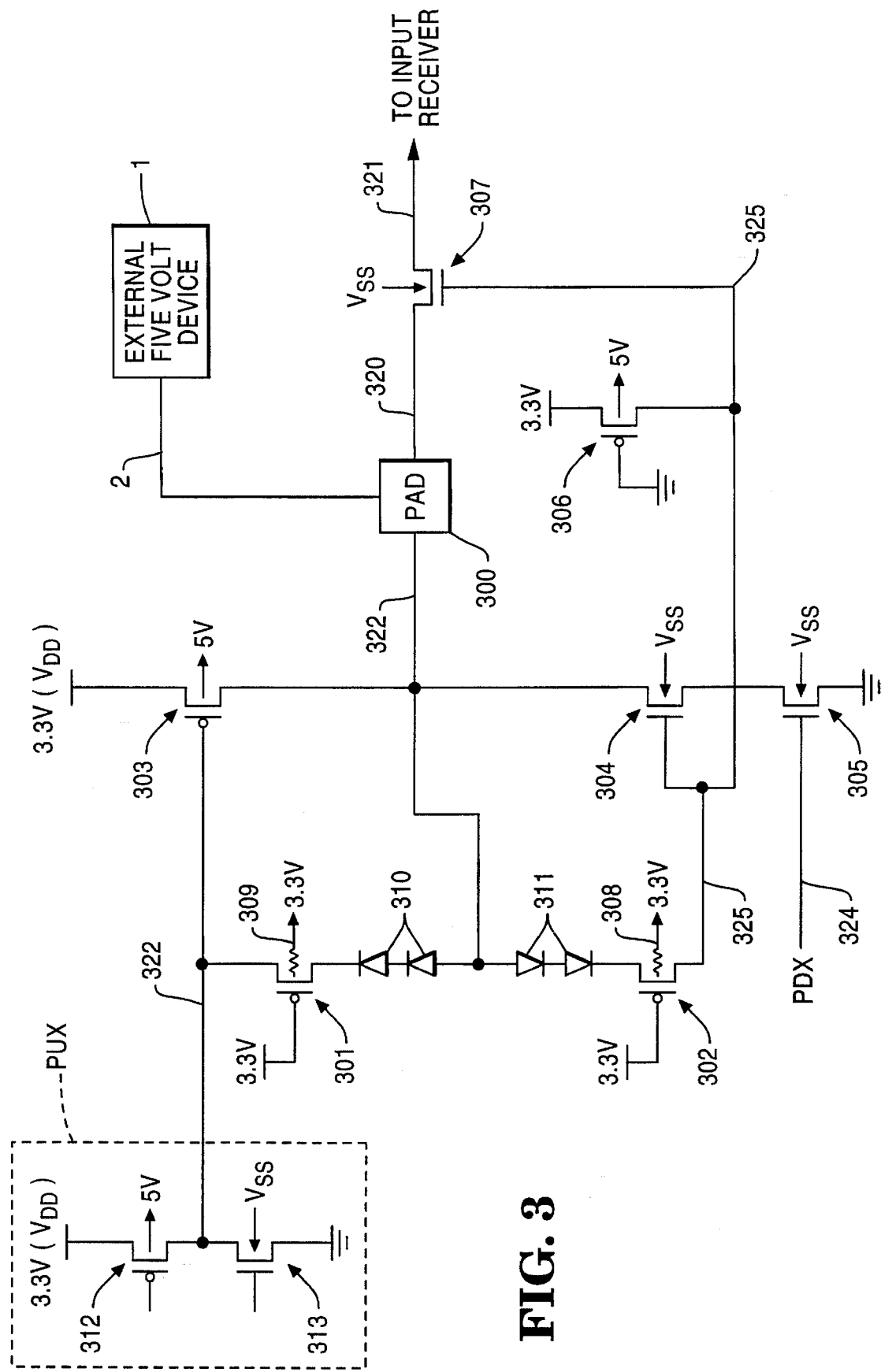
FIG. 3 is a circuit diagram of an I/O PAD designed in accord with the present invention which provides protection in both the power on and power off state for the associated functional I/O circuitry.

FIG. 3 illustrates the circuit of the present invention which solves the above problems by providing protection for the I/O circuitry both in power on and power off conditions. The circuit of the present invention depicted in FIG. 3 operates in most respects identically to that of FIGS. 1 and 2. Electrical signals applied by external circuits 1 to I/O PAD 300 over conductor 2 are sensed by input receiver circuitry via conductor 321. However, the electrical signal applied to I/O PAD 300 is first applied to the source of n-channel transistor 307 via conductor 320. The gate of transistor 307 is connected to conductor 325 and is charged to $V_{dd}$ (3.3 Volts) by operation of transistors 302 and 306 as described below. The substrate of transistor 307 is connected to $V_{ss}$. Transistor 307 protects the input receiver circuitry from potential damage caused by external circuits 1 applying 5 Volt electrical signals to I/O PAD 200 over conductor 2.

Electrical signals applied to conductors 322 and 324 by PUX and PDX circuits, respectively, serve to "tri-state", "pull-up", or "pull-down" conductor 322 by controlling the gates of p-channel transistor 303 and n-channel transistor 305. One of these three states is applied through conductor 322 onto I/O PAD 300 to drive output signals out to external circuits 1 over conductor 2 or to permit external circuits 1 to apply signals to I/O PAD 300 over conductor 2. The gate of n-channel transistor 304 is connected to conductor 325, and is charged to $V_{dd}$ (3.3 Volts) by operation of transistors 302 and 306 as described below. The substrate of transistor 304 is connected to $V_{ss}$. Transistor 304 limits the voltage applied to the source of transistor 305 to $V_{dd}$ (3.3 Volts). Transistor 304 protects transistor 305 from potential damage to the gate oxide of transistor 305 by external circuits 1 applying 5 Volt electrical signals to I/O PAD 300 over conductor 2. In addition, transistor 303 has its substrate connected to 5 Volts to prevent a 5 Volt signal applied to I/O PAD 300 from forward biasing the drain-substrate junction of transistor 303. If the substrate of transistor 303 were connected to $V_{dd}$, as in FIG. 1, and a 5 Volt signal were applied to I/O PAD 300, then current would flow from I/O PAD 300, through the drain-substrate junction of transistor 303, back to the power source.

The protection features of the circuitry of FIG. 3 operate identically to that of FIG. 2 when the circuit is in a power on state. Specifically, p-channel transistor 306 has its gate normally closed to pass through 3 Volts ($V_{dd}$ 3.3 Volts), connected to its source, to conductor 325, connected to its drain. Conductor 325 is connected to the gates of n-channel channel transistors 307 and 304. When the I/O circuitry is powered on, p-channel transistor 306 applies $V_{dd}$ voltage to the gates of n-channel transistors 307 and 304, thereby closing the gates of transistors 307 and 304 to permit them to protect I/O circuitry in a manner similar to the description above referring to n-channel transistors 204 and 202 of FIG. 2, respectively.

However, unlike the prior designs described above with reference to FIGS. 1 and 2, the protection circuits of FIG. 3 provide further protection of the I/O circuitry when the I/O circuits are in a powered off state. When the I/O circuits are powered off, i.e. no $V_{dd}$ is available from the source power supply, and a 5 Volt signal, an excess voltage, is applied to I/O PAD 300 by external circuits 1 over conductor 2, then p-channel transistors 301 and 302 serve to protect the remaining components of the I/O circuits. A 5 Volt signal applied to I/O PAD 300 will forward bias diode pairs 310 and 311. Diode pairs 310 and 311 are selected so that the potential of the signals passed through diode pairs 310 and 311 is reduced by two diode thresholds, (approximately 1.6 Volts in total), to approximately 3 Volts. Diodes are used to prevent the flow of current from signals applied on conductor 322 by PUX through p-channel transistors 301 and 302 onto I/O PAD 300 over conductor 322 during normal (powered on) operation. One of ordinary skill in the art will recognize that at least one diode is required to prevent the unintended flow of current described above. A plurality of diodes, or a diode in combination with other components may be used to provide the required potential drop during power off operation.

During powered on normal operation, the gates of p-channel transistors 301 and 302 are connected to $V_{dd}$ so that the gates remain open to prevent unwanted current flow from I/O PAD 300 through p-channel transistor 301 over conductor 322. During powered off operation, the $V_{dd}$ power supply connection to the I/O circuit will be held at approximately ground potential ($V_{ss}$). When a 5 Volt signal is applied to I/O PAD 300 by external circuits 1 over conductor 2, the gates of p-channel transistors 301 and 302 will close as their drain to substrate p-n junctions become forward biased and their substrates are charged from the 5 Volt signal over conductor 322 and through diode pairs 310 and 311. The resistance in the substrate material of p-channel transistors 301 and 302, indicated as resistors 309 and 308, respectively, helps to charge the substrate material as current flows into the substrate from the respective drains of the transistors connected to conductor 322. As the substrates of p-channel transistors 301 and 302 are charged and become positively charged with respect to their associated gates (which are held at approximately ground potential ($V_{ss}$)), the gates of p-channel transistors 301 and 302 will close. In this state, p-channel transistors 301 and 302 will produce, at their respective sources, a potential that is approximately a threshold drop below the potential at their respective drains.

The combined effects of the threshold drop across diode pairs 310 and 311, and p-channel transistors 301 and 302, results in a voltage drop from the 5 Volt potential of the signal externally applied to I/O PAD 300 to the gates of transistors 303, 304, and 307 of approximately 2.4 Volts (three threshold drops). Thus, when a 5 Volt signal is applied to I/O PAD 300 when the I/O circuit is in a powered off state, the gate oxide of transistors 303, 304, and 307, connected to I/O PAD 300, are protected by having their gates charged to a potential of between 2 and 3 Volts.

In other words, when the I/O circuitry is powered on, n-channel transistors 304 and 307 are controlled by p-channel transistor 306 to protect the I/O circuitry from application of an external 5 Volt signal to I/O PAD 300 by external circuits 1 over conductor 2. In this case, p-channel transistors 301 and 302 do not affect normal operation. When the I/O circuitry is powered off, p-channel transistors 301 and 302 are charged by the application of an external 5 Volt signal applied to I/O PAD 300 by external circuits 1 over conductor 2 to thereby charge the gates of p-channel transistor 303 and n-channel transistors 304 and 307. P-channel transistor 303 and n-channel transistors 304 and 307, in turn, protect the I/O circuitry from the external 5 Volt signal.

In the powered off state, when a 5 Volt signal is applied to I/O PAD 300 by external circuits 1 over conductor 2, the current flow through diode pairs 310 and 311, and transistors 301 and 302 is divided between the substrates of transistors 301 and 302. The current flows through transistor 302 onto conductor 325 and into the substrate of transistor 306. The substrate of transistor 306 is connected to a 5 Volt signal within the I/O circuit so that no current will be conducted into the 3.3 Volt ($V_{dd}$) conductors of the I/O circuits. Typical circuits within PUX (not shown in previous figures) are depicted in FIG. 3. P-channel transistor 312 is controlled to apply a high potential ($V_{dd}$) onto conductor 322 while n-channel transistor 313 is controlled to apply a low potential ($V_{ss}$) to conductor 322. Current from the external 5 Volt source applied to I/O PAD 300 flows through the substrate of transistor 301, as discussed above, and into the substrate of p-channel transistor 312. As discussed above with respect to transistor 306, the substrate of p-channel transistor 312 is connected to a 5 Volt conductor within the I/O circuit so that no current will be conducted into the 3.3 Volt ($V_{dd}$) conductors of the I/O circuits. The resistance of the substrate of transistors 312 and 306 relative to the resistance of the substrates of transistors 301 and 302 (indicated as resistors 309 and 308, respectively) determines the current flow through each. Preferably in the present invention, the resistance 308 and 309 is higher than the resistance of the substrates of transistors 312 and 306. This results in the majority of the current flowing through transistors 312 and 306 into the 5 Volt signal conductors of the I/O circuits.

It will be readily recognized by one of ordinary skill in the art that despite application of the circuits and methods of the present invention, the I/O circuitry to be protected may experience brief transient signals in excess of there optimal design of 3.3 Volts. Such brief transient "spikes" may occur while transistors 301 and 302 are charging, before they have passed through sufficient current to charge the gates of transistors 303, 304, and 307. It is well known that such brief "spikes" will not damage the I/O circuitry but that sustained application of a 5 Volt signal across the 3 Volt optimized gate oxide will damage the material.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected.

What is claimed is:

1. In combination:

an electrical PAD;

electrical circuits associated with said PAD operable for exchanging electrical signals between said PAD and an external electrical device; and protective electrical circuit means for protecting said electrical circuits from damage caused by application of an excess voltage potential to said PAD by said external electrical device, said protective electrical circuit means comprising:

protective device means associated with said electrical circuits for preventing said voltage potential from damaging said electrical circuits;

first means for applying power to said protective device means to protect said electrical circuits concomitant with operations of said electrical circuits when said electrical circuits are operating in a powered on state; and second means for applying power to said protective device means to protect said electrical circuits when said electrical circuits are in a powered off state.

2. The protective electrical circuit means of claim 1 wherein said protective device means comprises:

a semiconductor device connected serially between said PAD and said electrical circuits for limiting said voltage potential transmitted from said PAD to said electrical circuits.

3. The protective electrical circuit means of claim 1 wherein said second means for applying power comprises:

means for applying power from said external electrical device, through said PAD, to said protective device means.

4. In combination:

a bi-directional I/O PAD;

output electrical circuits associated with said I/O PAD for applying electrical signals to said I/O PAD;

input electrical circuits associated with said I/O PAD for sensing electrical signals applied to said I/O PAD by an external source, and wherein said input and output electrical circuits are optimized for 3 Volt operation; and protective electrical circuit means for protecting said input and output electrical circuits from damage caused by application of a potential about equal to 5 Volts to said I/O PAD by said external source, said protective electrical circuit means comprising:

protective device means associated with said input and output electrical circuits for preventing said voltage potential from damaging said input and output electrical circuits;

first means for applying power to said protective device means to protect said input and output electrical circuits concomitant with operations of said input and output electrical circuits when said input and output electrical circuits are operating in a powered on state; and second means for receiving and applying power from said about 5 Volt potential to said protective device means to protect said input and output electrical circuits when said input and output electrical circuits are in a powered off state.

5. The protective electrical circuit means of claim 4 wherein said protective device means comprises:

a first semiconductor device connected serially between said I/O PAD and said input electrical circuit for limiting said about 5 Volt potential transmitted from said I/O PAD to said input electrical circuit to about 3 Volts; and a second semiconductor device connected serially between said I/O PAD and said output electrical circuit for limiting said about 5 Volt potential transmitted from said I/O PAD to said output electrical circuit to about 3 Volts.

6. The protective electrical circuit of claim 4 wherein said second means for applying power comprises:

means for applying power from said about 5 Volt potential through said I/O PAD, to said protective device means.

7. In an electrical device optimized for about 3 Volt operation, having I/O electrical circuits for generating or sensing electrical signals applied to an I/O PAD for connection to external devices, a method for applying power to protective electrical circuits for protecting said I/O electrical circuits from damage caused by application of a potential of about 5 Volts to said I/O PAD by said external devices, said method comprising the steps of:

converting said potential of about 5 Volts to a first potential of about 3 Volts;

applying said first electric potential of about 3 Volts to said protective electrical circuits in response to said I/O electrical circuits being in a powered on operational state;

deriving an electric potential of about 3 Volts from said about 5 Volt potential applied to said I/O PAD to provide a derived electric potential of about 3 Volts; and applying said derived electric potential of about 3 Volts to said protective electrical circuits in response to said I/O circuits being in a powered off state.

8. In an electrical device optimized for operation at a first potential level having I/O electrical circuits for generating or sensing electrical signals applied to an I/O PAD for connection to external devices, a method for applying power to protective electrical circuits for protecting said I/O electrical circuits from damage caused by application to said I/O PAD of a second potential level in excess of said first potential level by said external devices, said method comprising the steps of:

converting said first potential level to about said first potential level;

applying electric potential of about said first potential level to said protective electrical circuits in response to said I/O electrical circuits being operational in a powered on state;

deriving an electric potential of about said first potential level from said second potential level applied to said I/O PAD; and applying said derived electric potential to said protective electrical circuits in response to said I/O circuits being in a powered off state.

* * * * *